(12) United States Patent
    Odate

(10) Patent No.: US 12,600,399 B2
(45) Date of Patent: Apr. 14, 2026

(54) STEERING APPARATUS

(71) Applicant: Honda Motor Co., Ltd., Tokyo (JP)

(72) Inventor: Shotaro Odate, Tokyo (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 19/017,726

(22) Filed: Jan. 12, 2025

(65) Prior Publication Data

US 2025/0229824 A1 Jul. 17, 2025

(30) Foreign Application Priority Data

Jan. 17, 2024 (JP) ................................. 2024-005083

(51) Int. Cl.

| | |
|---|---|
| B62D 1/04 | (2006.01) |
| B60W 50/08 | (2020.01) |
| B62D 1/06 | (2006.01) |
| G01D 5/241 | (2006.01) |
| G01R 27/26 | (2006.01) |

(52) U.S. Cl.
    CPC .............. B62D 1/046 (2013.01); B62D 1/06 (2013.01); B60W 50/085 (2013.01); G01D 5/241 (2013.01); G01R 27/2605 (2013.01)

(58) Field of Classification Search
    CPC ....... B62D 1/046; B62D 1/06; B60W 50/085; G01R 27/2605; G01D 5/241
    See application file for complete search history.

(56) References Cited

U.S. PATENT DOCUMENTS

| | | | | |
|---|---|---|---|---|
| 10,676,118 | B2 * | 6/2020 | Odate | ...................... B62D 1/06 |
| 10,974,736 | B2 * | 4/2021 | Odate | .............. B60W 60/0015 |
| 11,396,261 | B2 * | 7/2022 | Chiu | ...................... B62D 1/046 |
| 2016/0302730 | A1 * | 10/2016 | Odate | .................. A61B 5/6893 |
| 2024/0174293 | A1 * | 5/2024 | Nakamura | ........... B62D 15/029 |
| 2025/0147198 | A1 * | 5/2025 | Odate | .................... B62D 1/046 |
| 2025/0162642 | A1 * | 5/2025 | Odate | .................... B62D 1/046 |

FOREIGN PATENT DOCUMENTS

| | | | | |
|---|---|---|---|---|
| DE | 102021103676 A1 * | 8/2022 | ............. | G06F 3/017 |
| JP | 2022028505 A | 2/2022 | | |

* cited by examiner

*Primary Examiner* — Adam D Rogers
(74) *Attorney, Agent, or Firm* — Duft & Bornsen, PC

(57) ABSTRACT

A steering apparatus includes: a steering wheel including a hub portion, a grip portion, and spoke portions; a steering angle detection unit configured to detect a steering angle of the steering wheel; a sensor unit configured to detect contact or proximity of a human body to the grip portion; and a microprocessor. The microprocessor is configured to perform: setting a grip detection range along the grip portion, and determining whether gripping has been detected in the grip detection range, based on a detection value of the sensor unit. The microprocessor is configured to perform the setting unit. The microprocessor is configured to perform the setting including setting the grip detection range based on the steering angle detected by the steering angle sensor.

8 Claims, 7 Drawing Sheets

STEERING APPARATUS

CROSS-REFERENCE TO RELATED APPLICATION

This application is based upon and claims the benefit of priority from Japanese Patent Application No. 2024-005083 filed on Jan. 17, 2024, the content of which is incorporated herein by reference.

BACKGROUND

Technical Field

The present invention relates to a steering apparatus with a function for detecting whether a steering wheel is gripped by an occupant.

Related Art

In these years, there is a demand for a steering apparatus that achieves improvement of traffic safety and that contributes to development of a sustainable transportation system. In this regard, there has been conventionally known a device in which a touch sensor is disposed on an odd-shaped steering wheel including a steering portion having a generally square annular shape in a front view and having a width dimension in the left-right direction larger than a width dimension in the up-down direction, and a grip position is detected, based on a signal from the touch sensor (for example, see JP 2022-028505 A). In the device described in JP 2022-028505 A, grip portions are provided on both left and right sides of the steering wheel.

However, in the steering apparatus described in JP 2022-028505 A, when rotating the steering wheel about the steering center axis, the driver may grip a region other than the grip portion, such as an upper portion or a lower portion of the steering portion for a steering operation.

SUMMARY

An aspect of the present invention is a steering apparatus including: a steering wheel including a hub portion, a grip portion, and spoke portions, the grip portion including a pair of left and right vertical portions respectively extending substantially in an up-down direction on a left side and on a right side of the hub portion and the horizontal portion extending substantially in a left-right direction below the hub portion and connecting the pair of left and right vertical portions, the spoke portions respectively connecting the pair of left and right vertical portions with the hub portion; a steering angle detection unit configured to detect a steering angle of the steering wheel; a sensor unit configured to detect contact or proximity of a human body to the grip portion; and a microprocessor. The microprocessor is configured to perform: setting a grip detection range along the grip portion; and determining whether gripping has been detected in the grip detection range, based on a detection value of the sensor unit. The microprocessor is configured to perform the setting including setting the grip detection range, based on the steering angle detected by the steering angle sensor.

BRIEF DESCRIPTION OF DRAWINGS

The objects, features, and advantages of the present invention will become clearer from the following description of embodiments in relation to the attached drawings, in which.

DETAILED DESCRIPTION OF THE INVENTION

Figure 1:
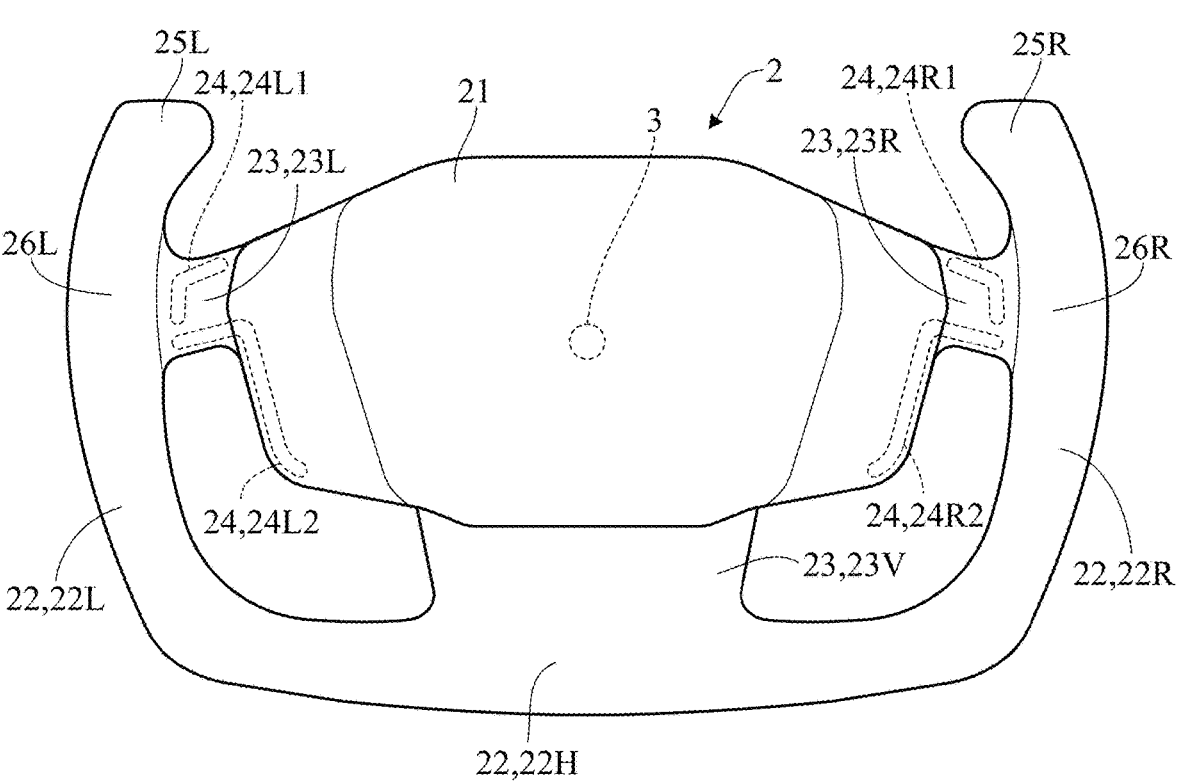
FIG. 1 is a front view of a steering wheel to which a steering apparatus according to an embodiment of the present invention is applied.

Hereinafter, embodiments of the invention will be described with reference to the drawings. FIG. 1 is a front view of a steering wheel to which a steering apparatus according to an embodiment of the present invention is applied. The steering apparatus according to an embodiment of the present invention is applicable to a manually driven vehicle including a driving assistance system such as advanced driver-assistance systems (ADAS). Note that the vehicle to which the steering apparatus according to the present embodiment is applied will be referred to as a subject vehicle in some cases to be distinguished from the other vehicles. A steering wheel 2 in FIG. 1 is operated by a driver on a driver's seat of the subject vehicle. A steering shaft 3, which pivotally supports the steering wheel 2, is coupled to the back side of the steering wheel 2 in a front view (as viewed from the driver).

As illustrated in FIG. 1, the steering wheel 2 is an odd-shaped steering wheel, and includes a hub portion 21, a rim portion (grip portion) 22, and a spoke portion 23, which connects the hub portion 21 with the rim portion 22. The rim portion 22 includes: a pair of left and right rim portions (vertical portions) 22L and 22R, which respectively extend substantially in an up-down direction on the left and right sides of the hub portion 21; and a horizontal portion 22H, which extends substantially in a left-right direction below the hub portion 21, and which connects the rim portions (vertical portions) 22L and 22R. The spoke portion 23 includes: horizontal portions 23L and 23R, which respectively connect the hub portion 21 with the rim portions (vertical portions) 22L and 22R, and a perpendicular portion 23V, which connects the hub portion 21 with the horizontal portion 22H. The rim portion (vertical portion) 22L is provided such that its end portion 25L protrudes upward from a connection portion 26L between the spoke portion (horizontal portion) 23L and the rim portion (vertical portion) 22L. Similarly, the rim portion (vertical portion) 22R is provided such that its end portion 25R protrudes upward from a connection portion 26R between the spoke portion (horizontal portion) 23R and the rim portion (vertical portion) 22R. Hereinafter, the end portions 25L and 25R will also be referred to as protrusion portions.

The spoke portion (horizontal portion) 23L incorporates electrodes 24L1 and 24L2, each of which has conductivity and is formed in a plate shape. The electrodes 24L1 and 24L2 are provided in the vicinity of a recommended grip region (a region AR1L in FIG. 4A to be described later) for the left hand that is defined with respect to the rim portion 22 in the steering wheel 2. More specifically, the electrode 24L1 is provided along a side wall surface in an upper portion and a side wall surface on a radially outer side of the spoke portion (horizontal portion) 23L. In addition, the electrode 24L2 is provided along a surface in a lower portion of the spoke portion (horizontal portion) 23L and a surface facing the rim portion 22 in a lower left portion of the hub portion 21.

Similarly, the spoke portion (horizontal portion) 23R incorporates electrodes 24R1 and 24R2, each of which has conductivity and is formed in a plate shape. The electrodes 24R1 and 24R2 are provided in the vicinity of a recommended grip region (a region AR1R in FIG. 4A to be described later) for the right hand that is defined with respect to the rim portion 22 in the steering wheel 2. More specifically, the electrode 24R1 is provided along a side wall surface in an upper portion and a side wall surface on a radially outer side of the spoke portion (horizontal portion) 23R. In addition, the electrode 24R2 is provided along a surface in a lower portion of the spoke portion (horizontal portion) 23R and a surface facing the rim portion 22 in a lower right portion of the hub portion 21.

The electrodes 24 (24L1, 24L2, 24R1, and 24R2) are respectively connected with sensor units 14L1, 14L2, 14R1, and 14R2 of a sensor unit (hereinafter, also referred to as grip sensors) 14 in FIG. 3 to be described later through signal lines, not illustrated.

The driving assistance system such as the ADAS, by the way, includes a lane keep assistant system (LKAS) that controls an actuator for driving (more specifically, a rudder actuator that drives a rudder device) to assist steering so that the subject vehicle travels near the center of the current lane. In a case where the lane keep assistant system is effective, a grip obligation of the steering wheel 2 is imposed on the driver in some cases so that the driver is able to accurately operate the steering wheel 2 immediately when necessary. In this case, the driving assistance system monitors whether the driver fulfills the grip obligation, and continues driving assistance (steering assistance) while the driver fulfills the grip obligation. On the other hand, when it is determined that the driver does not fulfill the grip obligation, the driving assistance system warns the driver via a display, a speaker, or the like installed in the vehicle. Alternatively, the driving assistance (steering assistance) is temporarily restricted.

Figure 2A:
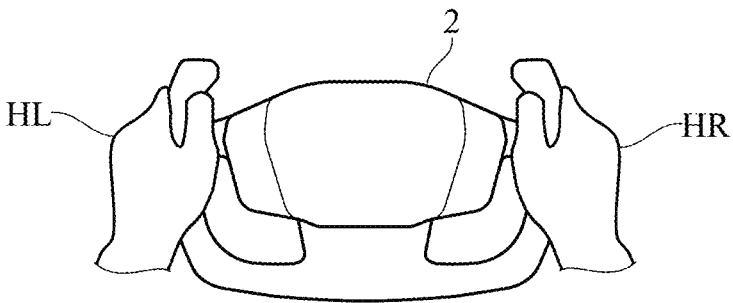
FIG. 2A is a diagram illustrating how the steering wheel is operated by a driver.
Figure 2B:
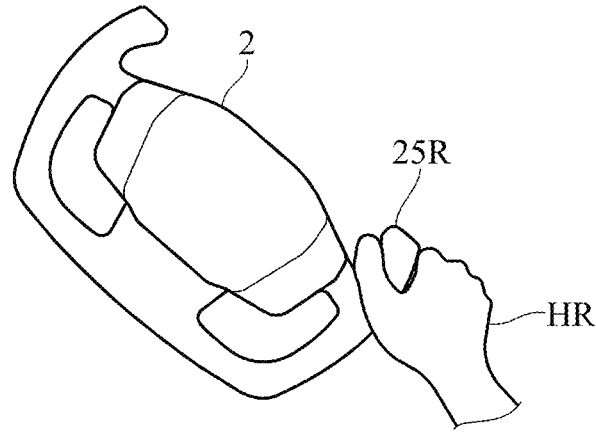
FIG. 2B is a diagram illustrating how the steering wheel is operated by the driver.

FIGS. 2A and 2B are diagrams illustrating how the steering wheel 2 is operated by the driver. As illustrated in FIG. 2A, when the driver grips the steering wheel 2 with both hands (a left hand HL and a right hand HR), the driver is able to accurately operate the steering wheel 2 immediately. Therefore, the driving assistance system determines that the grip obligation is fulfilled, and continues the driving assistance. On the other hand, in an odd-shaped steering wheel including the end portions 25L and 25R like the steering wheel 2, as illustrated in FIG. 2B, it is possible to perform the steering operation, by hooking the thumb or the like of one hand (the right hand HR in FIG. 2B) on the end portion 25R or the end portion 25L. Hence, there is a possibility that the driver performs the operation with one hand. However, when the lane keep assistant system is effective, it is difficult for the driver to accurately operate the steering wheel 2 immediately in a gripping state as illustrated in FIG. 2B. Hence, there is a possibility that safety at the time of driving assistance is impaired. Therefore, in order to handle such an issue, a steering apparatus is configured as follows in the present embodiment.

Figure 3:
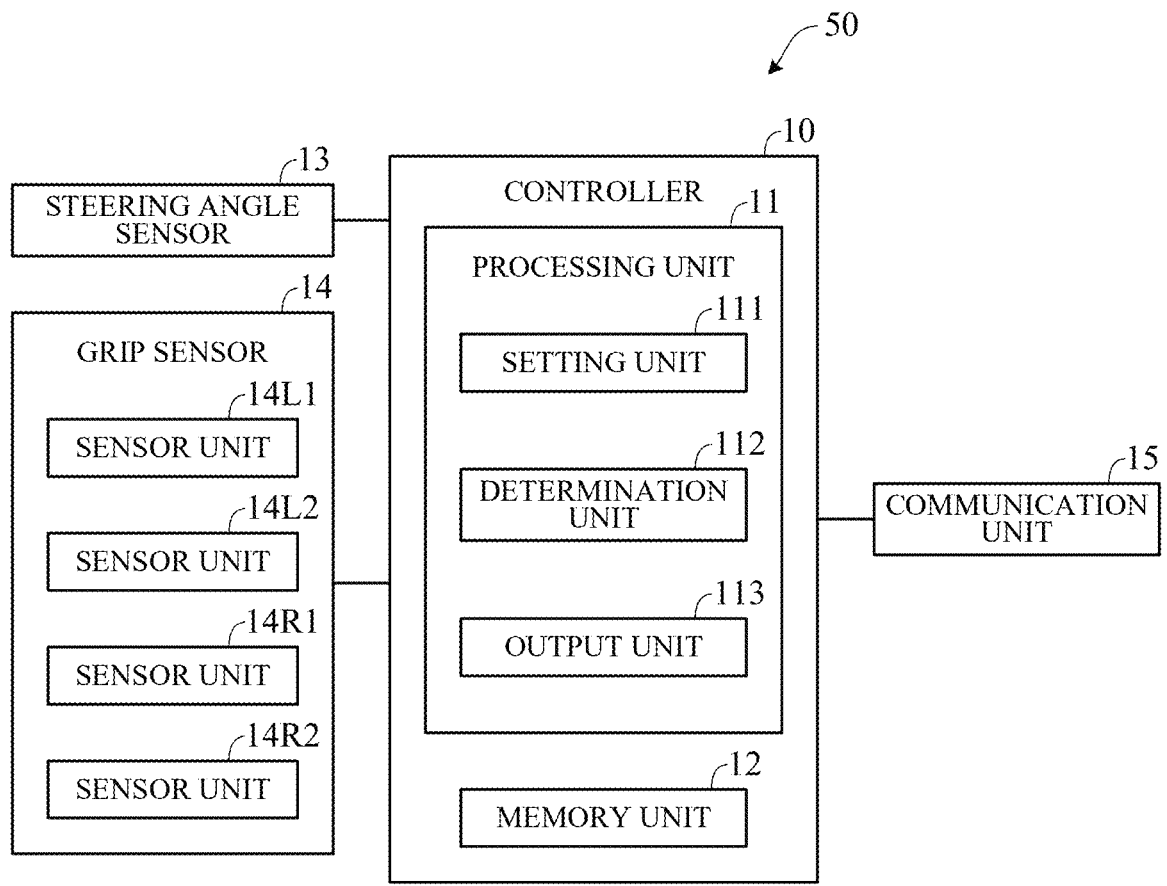
FIG. 3 is a block diagram illustrating a configuration of a main part of the steering apparatus according to the present embodiment.

FIG. 3 is a block diagram illustrating a configuration of a main part of the steering apparatus according to the present embodiment. As illustrated in FIG. 3, a steering apparatus 50 includes a controller 10, a steering angle sensor 13, a grip sensor 14, and a communication unit 15. The communication unit 15 connects the steering apparatus 50 to a communication network (network) such as a controller area network (CAN). The steering apparatus 50 is capable of communicating with an in-vehicle device, not illustrated, on CAN communication or the like via the communication unit 15. Note that the steering apparatus 50 may be capable of communicating with an in-vehicle device or an external device, not illustrated, through the wireless communication network.

The steering angle sensor 13 detects a steering angle in accordance with a steering operation of the driver. The steering angle is represented by a clockwise angle that is centered on the steering shaft 3 with reference to the center position in the left-right direction of an upper end portion of the hub portion 21 as viewed from the driver. In addition, the neutral position (0 [deg]) of the steering wheel 2 is a position where the steering wheel 2 is not operated in either the clockwise direction or the counterclockwise direction and the steering wheels (front wheels, rear wheels, or front and rear wheels) of the subject vehicle are not steered either to the left or to the right.

The grip sensor 14 includes the sensor units 14L1, 14L2, 14R1, and 14R2 respectively connected with the electrodes 24L1, 24L2, 24R1, and 24R2 in FIG. 1 through signal lines, not illustrated. The sensor units 14L1, 14L2, 14R1, and 14R2 respectively detect electric characteristics of the electrodes 24L1, 24L2, 24R1, and 24R2 (for example, electrostatic capacitance between the electrode and the ground (for example, a vehicle body)).

The controller 10 includes a processing unit 11 such as a central processing unit (CPU) and a memory unit 12. The processing unit 11 includes a setting unit 111, a determination unit 112, and an output unit 113 as functional configurations. The memory unit 12 stores programs for various types of control and information such as thresholds for use in the programs.

Figure 4A:
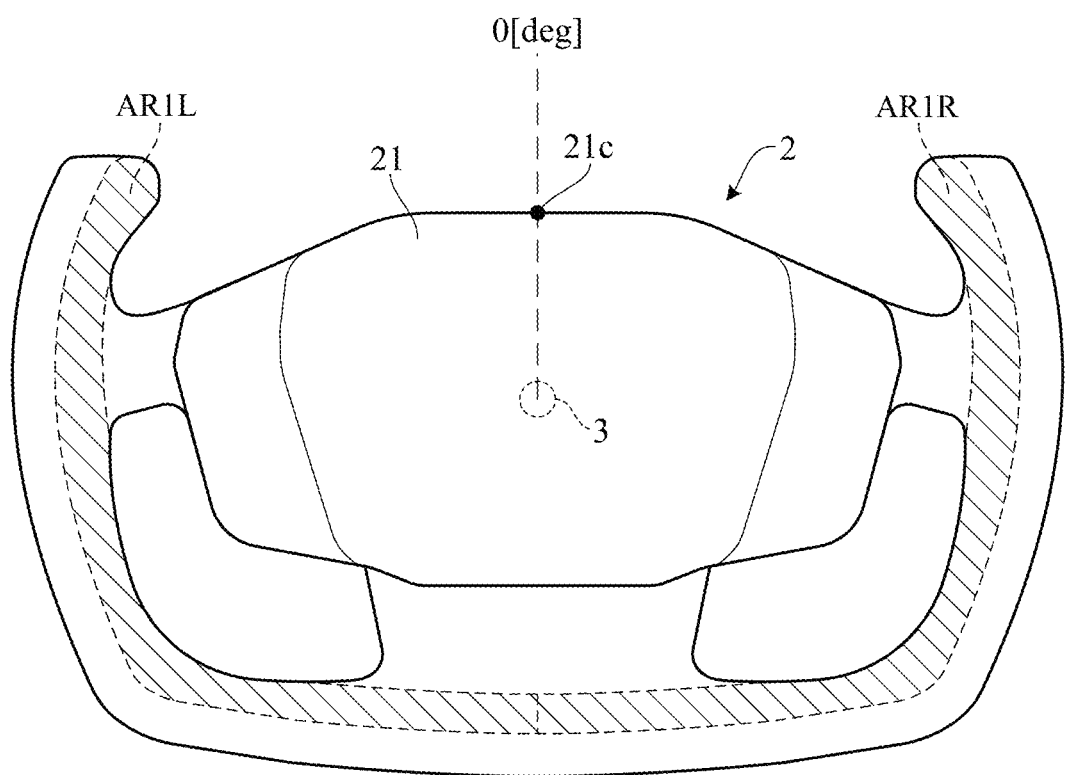
FIG. 4A is a diagram illustrating an example of a grip detection range set by the setting unit in FIG. 3.

The setting unit 111 sets a grip detection range along the rim portion 22. FIG. 4A is a diagram illustrating an example of the grip detection range set by the setting unit 111. The grip detection range is a range in which the driver's grip on the steering wheel 2 is to be detected, and is set to correspond to a recommended grip region AR1L for the driver's left hand and a recommended grip region AR1R for the driver's right hand. The recommended grip regions AR1L and AR1R are predetermined on the rim portion 22. Specifically, a region obtained by combining the recommended grip region AR1L and the recommended grip region AR1R is set as the grip detection range.

Figure 4B:
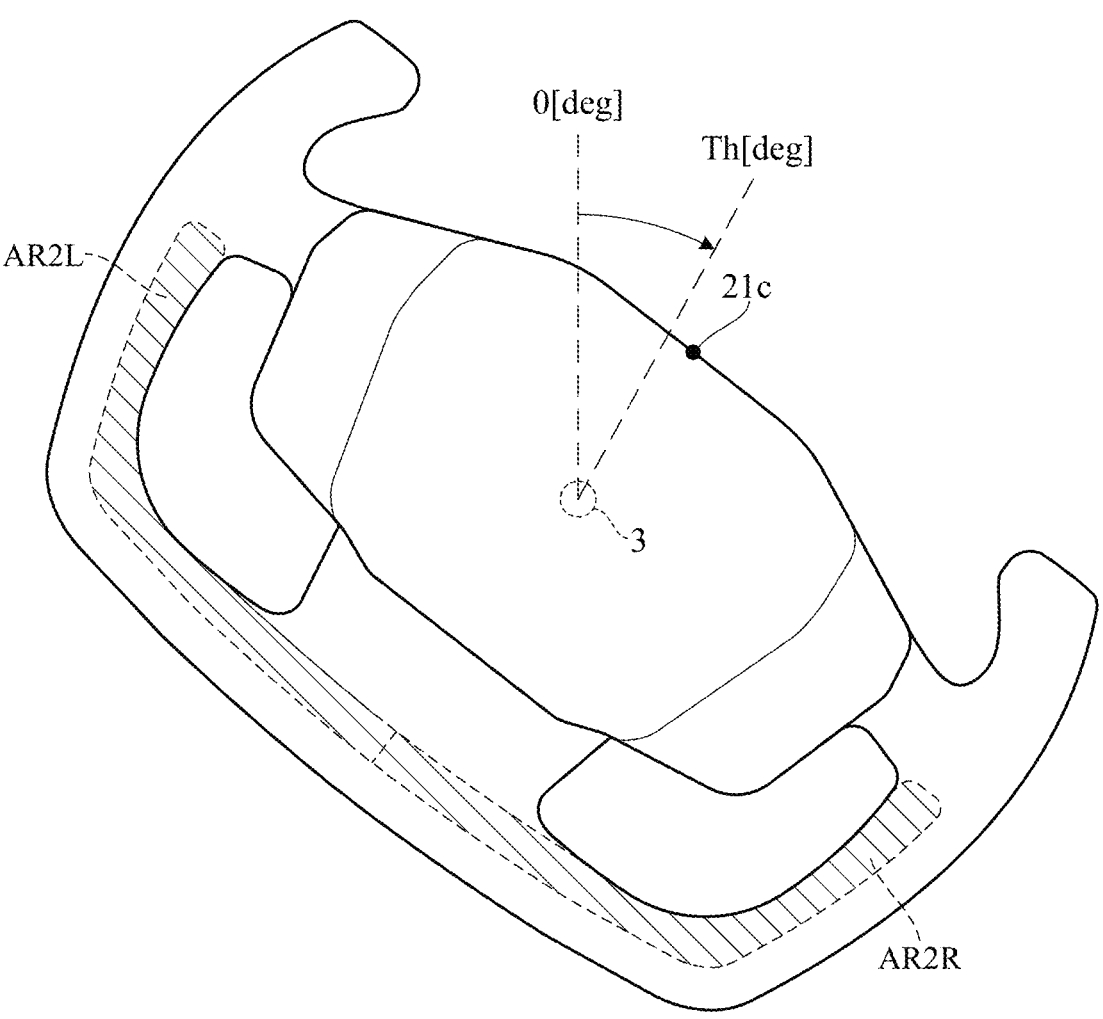
FIG. 4B is a diagram illustrating another example of the grip detection range set by the setting unit in FIG. 3.

In addition, the setting unit 111 changes the grip detection range, based on the steering angle detected by the steering angle sensor 13. Specifically, in a case where the steering angle detected by the steering angle sensor 13 is equal to or larger than a predetermined value Th [deg], the setting unit 111 resets the grip detection range so that the end portions 25L and 25R are excluded from the grip detection range. FIG. 4B is a diagram illustrating another example of the grip detection range set by the setting unit 111. The regions AR2L and AR2R illustrated in FIG. 4B are regions obtained by excluding the regions corresponding to the end portions 25L and 25R from the recommended grip regions AR1L and AR1R in FIG. 4A. In this manner, in the case where the steering angle detected by the steering angle sensor 13 is equal to or larger than the predetermined value Th, the setting unit 111 changes the grip detection range from the recommended grip regions AR1L and AR1R to the regions AR2L and AR2R in FIG. 4B.

The determination unit 112 determines whether the steering wheel 2 is gripped by the driver, based on a detection result of the grip sensor 14. Specifically, the determination unit 112 detects contact or proximity of the human body to the electrode 24 (action of approaching within a predetermined distance), based on a detection value (capacitance) of the grip sensor 14. More specifically, in a case where the detection value (capacitance) of the grip sensor 14 is equal to or larger than a proximity determination threshold value, the proximity is determined, and in a case where the detection value is equal to or larger than a contact determination threshold value, which is larger than the proximity determination threshold value, the contact is determined. Upon determination that the steering wheel 2 is gripped by the driver, the determination unit 112 further detects a gripping position, based on a detection result of the grip sensor 14, and determines whether the gripping position is included in the grip detection range.

The output unit 113 determines a gripping state, based on a determination result of the determination unit 112, and outputs information (hereinafter, referred to as gripping state information) indicating the gripping state to an output device mounted on the subject vehicle. The output device is a generic term for devices that output information to the driver. The output device includes a display that provides the driver with information via a display image, a speaker that provides the driver with information by sound, and the like.

In a case where the determination unit 112 determines that the steering wheel 2 is gripped, and also determines that the gripping position is included in the grip detection range, the output unit 113 outputs the gripping state information indicating "normal" as the gripping state. On the other hand, even though the determination unit 112 determines that the steering wheel 2 is gripped, in a case where the gripping position is not included in the grip detection range, the output unit 113 outputs the gripping state information indicating "non-gripping" as the gripping state. In addition, in a case where the determination unit 112 determines that the steering wheel 2 is not gripped, the output unit 113 outputs the gripping state information indicating "non-gripping" as the gripping state. Note that in outputting the gripping state information indicating "non-gripping", the output unit 113 may include warning information for prompting the driver to grip the steering wheel 2 in the gripping state information. The warning information may include a signal for turning on or blinking a warning light or the like provided on the steering wheel 2 or provided near the steering wheel 2 (an instrument panel or the like), in addition to display information or sound information output to a display, a speaker, or the like. Further, the output unit 113 may output gripping state information to an in-vehicle device or an external device via the communication unit 15.

Figure 5:
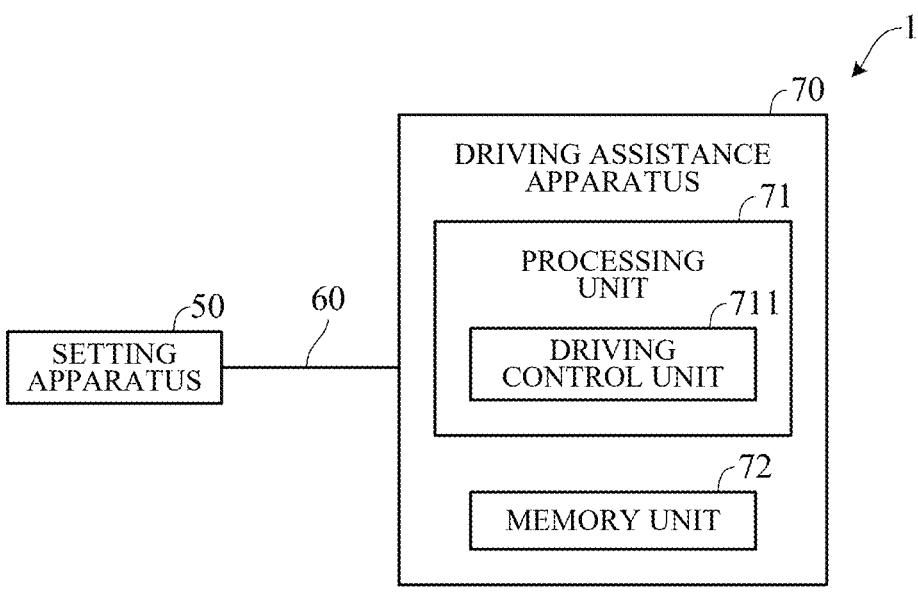
FIG. 5 is a diagram illustrating an example of a configuration of a driving assistance system including the steering apparatus according to the present embodiment.

FIG. 5 is a diagram illustrating an example of a configuration of a driving assistance system 1 including the steering apparatus 50 according to the present embodiment. As illustrated in FIG. 5, the driving assistance system 1 includes the steering apparatus 50 and a driving assistance apparatus 70, which is one of in-vehicle devices. The steering apparatus 50 is communicably connected with the driving assistance apparatus 70 through a CAN bus 60.

The driving assistance apparatus 70 includes an electronic control unit (ECU). The driving assistance apparatus 70 includes a processing unit 71 such as a central processing unit (CPU) and a memory unit 72. The processing unit 71 includes a driving control unit 711 as a functional configuration. The memory unit 72 stores programs for various types of control and information such as thresholds for use in the programs. The driving control unit 711 controls an actuator for driving, not illustrated, based on information (such as a camera image) obtained from an in-vehicle sensor. The actuator for driving includes a throttle actuator that adjusts an opening degree of a throttle valve (a throttle opening degree) of an engine, a brake actuator that actuates a braking device of the subject vehicle, a rudder actuator that drives a rudder device, and the like.

The driving assistance apparatus 70 has various driving assistance functions such as the LKAS and adaptive cruise control (ACC). When the LKAS is effective, the driving control unit 711 recognizes a division line that defines the current lane, based on information that has been obtained from the in-vehicle sensor, and controls the rudder actuator so that the subject vehicle travels near the center of the current lane. In this timing, the driving control unit 711 acquires the gripping state information output from the output unit 113 of the steering apparatus 50 through the CAN bus 60, and recognizes the gripping state on the steering wheel 2, based on the gripping state information. When recognizing that the driver does not grip the steering wheel 2, the driving control unit 711 temporarily stops the driving assistance (steering assistance) by the LKAS. When the driver's non-gripping state continues for a predetermined time, the driving control unit 711 cancels the steering assistance. When the driver's grip on the steering wheel 2 is recognized before the driver's non-gripping state continues for a predetermined time, the temporarily stopped steering assistance is restarted. In this manner, the gripping state information output from the steering apparatus 50 is used for controlling temporary stop, restart, cancellation, or the like of the driving assistance function in the driving assistance apparatus 70.

Figure 6:
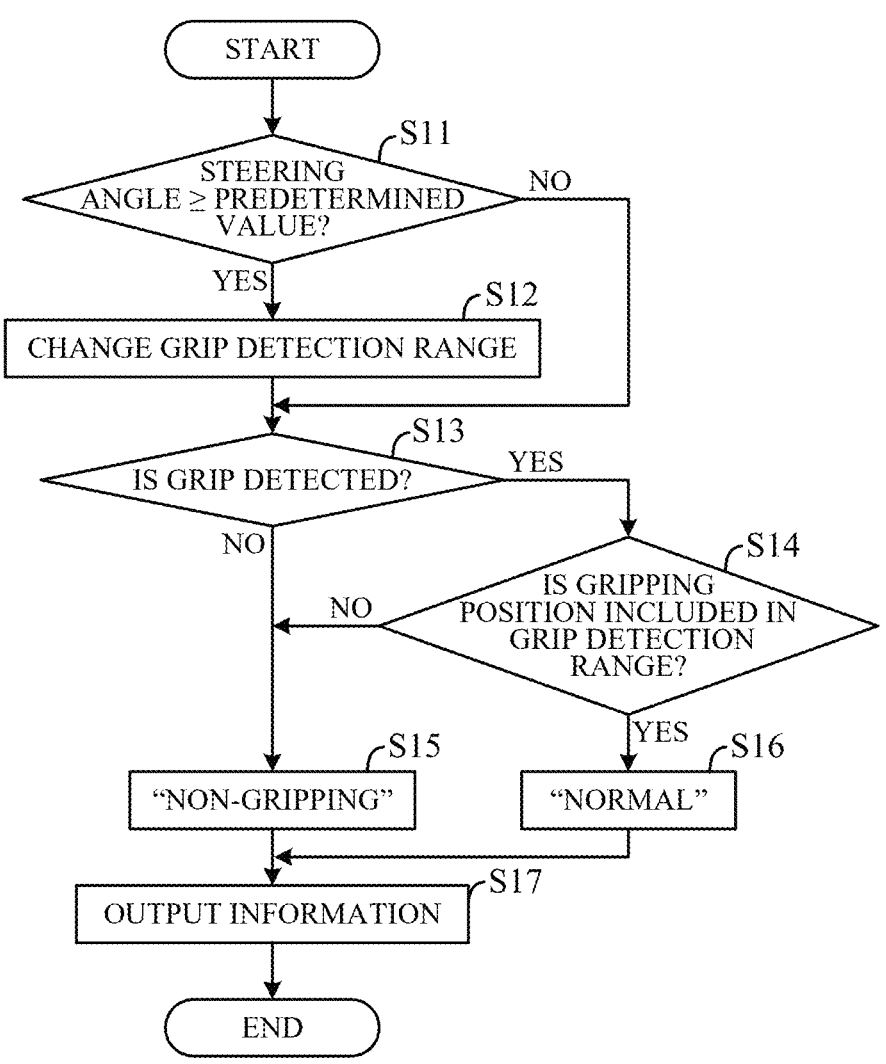
FIG. 6 is a flowchart illustrating an example of processing to be performed by the controller in FIG. 3.

FIG. 6 is a flowchart illustrating an example of processing to be performed by the CPU of the controller 10 in FIG. 3 in accordance with a predetermined program. The processing illustrated in this flowchart is performed at a predetermined cycle while the subject vehicle is traveling, for example. Note that when the subject vehicle starts traveling, the recommended grip regions AR1L and AR1R in FIG. 4A are set as the grip detection range.

First, in step S11, the controller 10 determines whether a sensor value (steering angle) of the steering angle sensor 13 is equal to or larger than a predetermined value. In a case where an affirmative determination is made in step S11, the controller 10 changes the grip detection range to the regions of FIG. 4B, that is, the regions AR2L and AR2R in which the regions corresponding to the end portions 25L and 25R are excluded from the recommended grip regions AR1L and AR1R, in step S12. In a case where a negative determination is made in step S11, the controller 10 advances the processing to step S13 without changing the grip detection ranges (that is, sets the grip detection ranges to the recommended grip regions AR1L and AR1R). In step S13, the controller 10 determines whether the driver's grip on the rim portion 22 is detected, based on a detection result of the grip sensor 14. In a case where a negative determination is made in step S13, the controller 10 determines that the steering wheel 2 is not gripped, and generates gripping state information indicating "non-gripping" in step S15. In a case where an affirmative determination is made in step S13, the controller 10 further detects the gripping position, based on the detection result of the grip sensor 14, and determines whether the gripping position that has been detected is included in the grip detection range in step S14 In a case where an affirmative determination is made in step S14, the controller 10 determines that the steering wheel 2 is correctly gripped by the driver, and generates the gripping state information indicating "normal" in step S16. On the other hand, in a case where a negative determination is made in step S14, the controller 10 determines that the steering wheel 2 is not correctly gripped by the driver, and advances the processing to step S15. In step S17, the controller 10 outputs the gripping state information generated in step S15 or step S16, and ends the processing.

According to the above processing, in the case where the steering angle is equal to or larger than the predetermined value while the subject vehicle is traveling, the regions AR2L and AR2R in FIG. 4B are set as the grip detection range until the steering angle is smaller than the predetermined value. When the steering angle is smaller than the predetermined value, the recommended grip regions AR1L and AR1R in FIG. 4A are set as the grip detection ranges. In this manner, the controller 10 changes the grip detection range in accordance with the steering angle of the steering wheel 2 in accordance with the flowchart of FIG. 6.

According to the above-described embodiment, the following effects are achievable.

(1) The steering apparatus 50 includes: the steering wheel 2 including the hub portion 21, the rim portion (grip portion) 22, and the spoke portions 23L and 23R, the rim portion (grip portion) 22 including the pair of left and right vertical portions 22L and 22R respectively extending substantially in the up-down direction on the left side and on the right side of the hub portion 21 and the horizontal portion 22H extending substantially in the left-right direction below the hub portion 21 and connecting the pair of left and right vertical portions 22L and 22R, the spoke portions 23L and 23R respectively connecting the pair of left and right vertical portions 22L and 22R with the hub portion 21; the steering angle sensor 13, which detects a steering angle of the steering wheel 2; the sensor unit 14, which detects contact or proximity of a human body to the rim portion 22; the setting unit 111, which sets a grip detection range along the rim portion 22; and the determination unit 112, which determines whether gripping has been detected in the grip detection range set by the setting unit 111, based on a detection value of the sensor unit 14. The setting unit 111 sets the grip detection range, based on the steering angle that has been detected by the steering angle sensor 13. The end portions 25L and 25R of the rim portion 22 are provided to protrude upward relative to the spoke portions 23L and 23R. The setting unit 111 sets beforehand the recommended grip regions AR1L and AR1R including the end portions 25L and 25R as the grip detection range. In a case where the steering angle detected by the steering angle sensor 13 is equal to or larger than a predetermined value, the setting unit 111 changes the grip detection range from the recommended grip regions AR1L and AR1R to the regions AR2L and AR2R in which the end portions 25L and 25R are excluded. The predetermined value is, for example, a steering angle detected by the steering angle sensor 13, when the steering wheel 2 is steered clockwise and counterclockwise by 30 degrees ([deg]) from the neutral position. Accordingly, a grip on an improper gripping position as illustrated in FIG. 2B is determined to be the non-gripping state, so that the accuracy in the grip determination of gripping an odd-shaped steering wheel can be further improved.

(2) The steering apparatus 50 further includes the output unit 113, which outputs information including a determination result of the determination unit 112 to an external device (an output device (a display, a speaker, or the like) or the driving assistance apparatus 70). This enables the driver to recognize a result of the grip determination. In addition, the result of the grip determination can be used for the driving assistance function such as the LKAS. As a result, the safety while operating the odd-shaped steering wheel can be improved.

The above-described embodiments can be modified in various manners. Hereinafter, modifications will be described. In the above embodiment, the sensor unit 14 detects contact or proximity of the human body to the rim portion 22. However, the sensor unit may further detect gripping force of gripping the rim portion 22. In this case, a pressure sensitive sensor is incorporated in the rim portion 22, and the sensor unit detects the gripping force on the steering wheel 2, based on a sensor value obtained from the pressure sensitive sensor through a signal line, not illustrated. Note that any sensor other than the pressure sensitive sensor may be used for detecting the gripping force on the steering wheel 2. In a case where a detection value of the sensor unit is equal to or larger than a predetermined threshold, the setting unit 111 sets the grip detection range to the recommended grip regions AR1L and AR1R, even though the steering angle detected by the steering angle sensor 13 is equal to or larger than the predetermined value. This enables suppression of unnecessary determination of non-gripping, when the driver firmly grips the end portions 25L and 25R and performs the steering operation.

In addition, in the above embodiment, the determination unit 112 determines whether the grip has been detected in the grip detection range, based on a detection value of the sensor unit 14, and the output unit 113 outputs the gripping state information including a determination result of the determination unit 112 to an external device. However, the determination unit may determine whether the grip of the left hand has been detected in the grip detection range (the recommended grip region AR1L or region AR2L) corresponding to the left hand, and may determine whether the grip of the right hand has been detected in the grip detection range (the recommended grip region AR1R or region AR2R) corresponding to the right hand. The output unit may output, to an external device, the gripping state information based on a determination result corresponding to the left hand (hereinafter, referred to as a first determination result) and a determination result corresponding to the right hand (hereinafter, referred to as a second determination result). For example, the output unit may output the gripping state information indicating "normal" as the gripping state, in a case where it is determined that the steering wheel 2 is gripped by both hands, based on the first determination result and the second determination result. On the other hand, in a case where it is determined that the steering wheel 2 is gripped by any one of the hands, the output unit may output the gripping state information indicating "non-gripping" as the gripping state. In this timing, warning information for prompting the driver to grip the steering wheel 2 with both hands may be included in the gripping state information.

In the above embodiment, in the case where the steering angle detected by the steering angle sensor 13, which serves as a steering angle detector, is equal to or larger than the predetermined value, the setting unit 111 changes the grip detection range from the recommended grip regions AR1L and AR1R, which are first regions, to the regions AR2L and AR2R, which are second regions, and excludes the end portions 25L and 25R from the grip detection range. However, in the case where the steering angle is equal to or larger than the predetermined value, the method for excluding the end portions 25L and 25R from the grip detection range is not limited to this. For example, in the case where the steering angle is equal to or larger than the predetermined value, the grip determination thresholds may be made different between portions other than the end portions 25L and 25R of the rim portion 22 and the end portions 25L and 25R. Specifically, the determination unit 112 compares a detection value of the sensor unit 14L with a first predetermined threshold, and determines whether the rim portion 22 is gripped, based on its comparison result. On the other hand, in a case where the steering angle is equal to or larger than the predetermined value and in the case where the position where the contact or the proximity of the human body is detected by the sensor unit 14 is included in the end portions 25L and 25R, the determination unit 112 compares the detection value of the sensor unit 14 with a second predetermined threshold different from the first predetermined threshold, and determines whether the rim portion 22 is gripped, based on its comparison result. More specifically, the determination unit 112 determines that the rim portion 22 is gripped, in a case where the detection value of the sensor unit 14 is equal to or larger than the first predetermined threshold value. On the other hand, in the case where the steering angle is equal to or larger than the predetermined value and in the case where the position where the contact or the proximity of the human body is detected by the sensor unit 14 is included in the end portions 25L and 25R, the determination unit 112 determines that the rim portion 22 is gripped, in the case where the detection value of the sensor unit 14 is equal to or larger than the second predetermined threshold value that is larger than the first predetermined threshold value.

In the above embodiment, the case where the controller 10 performs the processing of FIG. 6 while the subject vehicle is traveling has been given as an example. However, the controller 10 may start the processing of FIG. 6, when receiving a notification indicating that the driving assistance function such as the LKAS is effective from the driving assistance apparatus 70. In addition, while the traveling speed of the subject vehicle is equal to or lower than a predetermined speed, the controller 10 may be configured not to perform the processing of FIG. 6. Furthermore, while the driving assistance function such as an automatic parking function (parking assist system) that does not necessitate the driver to grip the steering wheel 2 is effective, the controller 10 may be configured not to perform the processing of FIG. 6.

Furthermore, in the above embodiment, the steering apparatus 50 is applied to the manually driven vehicle including the ADAS. However, the steering apparatus 50 is also applicable to an automatically driven vehicle.

The above embodiment can be combined as desired with one or more of the above modifications. The modifications can also be combined with one another.

According to the present invention, it becomes possible to satisfactorily make the grip determination of gripping the odd-shaped steering wheel.

Above, while the present invention has been described with reference to the preferred embodiments thereof, it will be understood, by those skilled in the art, that various changes and modifications may be made thereto without departing from the scope of the appended claims.

What is claimed is:

1. A steering apparatus comprising:
a steering wheel including a hub portion, a grip portion, and spoke portions, the grip portion including a pair of left and right vertical portions respectively extending substantially in an up-down direction on a left side and on a right side of the hub portion and a horizontal portion extending substantially in a left-right direction below the hub portion and connecting the pair of left and right vertical portions, the spoke portions respectively connecting the pair of left and right vertical portions with the hub portion;
a steering angle detection unit configured to detect a steering angle of the steering wheel;
a sensor unit configured to detect contact or proximity of a human body to the grip portion; and
a microprocessor, wherein
the microprocessor is configured to perform:
setting a grip detection range along the grip portion; and
determining whether gripping has been detected in the grip detection range, based on a detection value of the sensor unit, wherein
the microprocessor is configured to perform
the setting including setting the grip detection range, based on the steering angle detected by the steering angle sensor.

2. The steering apparatus according to claim 1, wherein
end portions of the grip portion are provided to protrude upward relative to the spoke portions, and
the microprocessor is configured to perform
the setting including setting beforehand a first region including the end portions as the grip detection range, in a case where the steering angle detected by the steering angle detection unit is equal to or larger than a predetermined value, changing the grip detection range from the first region to a second region in which the end portions are excluded.

3. The steering apparatus according to claim 2, wherein
the predetermined value is the steering angle detected by the steering angle detection unit, when the steering wheel is steered clockwise and counterclockwise by 30 degrees from a neutral position.

4. The steering apparatus according to claim 1, wherein
the microprocessor is configured to further perform
outputting information including a result of the determining to an external device.

5. The steering apparatus according to claim 4, wherein
the microprocessor is configured to perform
the determining including determining whether a grip of a left hand has been detected in the grip detection range corresponding to the left hand, and determining whether a grip of a right hand has been detected in the grip detection range corresponding to the right hand, and
the outputting including outputting, to the external device, gripping state information indicating a gripping state based on a first determination result corresponding to the left hand and a second determination result corresponding to the right hand.

6. The steering apparatus according to claim 5, wherein
the microprocessor is configured to perform
the outputting including outputting the gripping state information indicating that the steering wheel is properly gripped, in a case where it is determined that the steering wheel is gripped by both hands, based on the first determination result and the second determination result, and outputting the gripping state information indicating that the steering wheel is not properly gripped, in a case where it is determined that the steering wheel is gripped by any one of the hands.

7. A steering apparatus comprising:

a steering wheel including a hub portion, a grip portion, and spoke portions, the grip portion including a pair of left and right vertical portions respectively extending substantially in an up-down direction on a left side and on a right side of the hub portion and a horizontal portion extending substantially in a left-right direction below the hub portion and connecting the pair of left and right vertical portions, the spoke portions connecting the grip portion with the hub portion;

a steering angle detection unit configured to detect a steering angle of the steering wheel;

a sensor unit configured to detect contact or proximity of a human body to the grip portion; and a microprocessor, wherein the microprocessor is configured to perform:

comparing a detection value of the sensor unit with a first predetermined threshold; and determining whether the grip portion is gripped, based on a result of the comparing, and end portions of the grip portion are provided to protrude upward relative to the spoke portions, wherein the microprocessor is configured to perform:

the comparing including, in a case where the steering angle detected by the steering angle detection unit is equal to or larger than a predetermined value and a position where the contact or the proximity of the human body is detected by the sensor unit is included in the end portions, comparing the detection value of the sensor unit with a second predetermined threshold different from the first predetermined threshold; and the determining including determining whether the grip portion is gripped, based on the result of the comparing.

8. The steering apparatus according to claim 7, wherein the microprocessor is configured to perform the determining including determining that the grip portion is gripped when the detection value of the sensor unit is equal to or larger than a first predetermined threshold value, and in the case where the steering angle is equal to or larger than the predetermined value and the position where the contact or the proximity of the human body is detected by the sensor unit is included in the end portions, determining that the grip portion is gripped when the detection value of the sensor unit is equal to or larger than a second predetermined threshold value larger than the first predetermined threshold value.

* * * * *